United States Patent
Pavel et al.

(10) Patent No.: US 7,648,916 B2
(45) Date of Patent: Jan. 19, 2010

(54) METHOD AND APPARATUS FOR PERFORMING HYDROGEN OPTICAL EMISSION ENDPOINT DETECTION FOR PHOTORESIST STRIP AND RESIDUE REMOVAL

(75) Inventors: Elizabeth G. Pavel, San Jose, CA (US); Mark N. Kawaguchi, Mountain View, CA (US); James S. Papanu, San Rafael, CA (US)

(73) Assignee: Applied Materials, Inc., Santa Clara, CA (US)

( * ) Notice: Subject to any disclaimer, the term of this patent is extended or adjusted under 35 U.S.C. 154(b) by 567 days.

(21) Appl. No.: 11/467,842

(22) Filed: Aug. 28, 2006

(65) Prior Publication Data

US 2006/0289384 A1 Dec. 28, 2006

Related U.S. Application Data

(63) Continuation of application No. 10/776,672, filed on Feb. 11, 2004, now abandoned.

(60) Provisional application No. 60/447,625, filed on Feb. 15, 2003.

(51) Int. Cl.
*H01L 21/302* (2006.01)

(52) U.S. Cl. .............. 438/708; 438/709; 438/725; 216/59; 216/60

(58) Field of Classification Search .......... 438/708, 438/709, 725; 216/59, 60
See application file for complete search history.

(56) References Cited

U.S. PATENT DOCUMENTS

| | | |
|---|---|---|
| 4,936,967 A | 6/1990 | Ikuhara et al. |
| 5,174,856 A | 12/1992 | Hwang et al. |
| 5,200,031 A | 4/1993 | Latchford et al. |
| 5,221,424 A | 6/1993 | Rhoades |
| 5,262,279 A * | 11/1993 | Tsang et al. ............ 430/311 |
| 5,384,009 A | 1/1995 | Mak et al. |
| 5,397,432 A | 3/1995 | Konno et al. |
| 5,545,289 A | 8/1996 | Chen et al. |
| 5,871,658 A | 2/1999 | Tao et al. |
| 5,877,032 A | 3/1999 | Guinn et al. |
| 5,986,747 A | 11/1999 | Moran |
| 6,352,870 B1 | 3/2002 | Lansford |
| 6,419,801 B1 | 7/2002 | Smith, Jr. et al. |
| 6,492,186 B1 | 12/2002 | Han et al. |
| 6,521,003 B2 | 2/2003 | Swanepoel et al. |
| 2001/0027023 A1* | 10/2001 | Ishihara ................ 438/706 |
| 2002/0135761 A1* | 9/2002 | Powell et al. ........... 356/316 |
| 2002/0151156 A1* | 10/2002 | Hallock et al. .......... 438/531 |
| 2002/0198682 A1 | 12/2002 | Huang et al. |
| 2003/0015660 A1 | 1/2003 | Shishido et al. |

OTHER PUBLICATIONS

Definition of the term "plasma"; http://dictionary.reference.com/search?q=plasma.

* cited by examiner

*Primary Examiner*—Binh X Tran
(74) *Attorney, Agent, or Firm*—Moser IP Law Group

(57) ABSTRACT

Methods for monitoring and detecting optical emissions while performing photoresist stripping and removal of residues from a substrate or a film stack on a substrate are provided herein. In one embodiment, a method is provided that includes positioning a substrate comprising a photoresist layer into a processing chamber; processing the photoresist layer using a multiple step plasma process; and monitoring the plasma for a hydrogen optical emission during the multiple step plasma process; wherein the multiple step plasma process includes removing a bulk of the photoresist layer using a bulk removal step; and switching to an overetch step in response to the monitored hydrogen optical emission.

21 Claims, 6 Drawing Sheets

METHOD AND APPARATUS FOR PERFORMING HYDROGEN OPTICAL EMISSION ENDPOINT DETECTION FOR PHOTORESIST STRIP AND RESIDUE REMOVAL

CROSS-REFERENCE TO RELATED APPLICATIONS

This application is a continuation of U.S. patent application Ser. No. 10/776,672, filed Feb. 11, 2004, now abandoned, which claims benefit of U.S. provisional patent application Ser. No. 60/447,625, filed Feb. 15, 2003. Each of the aforementioned related patent applications is herein incorporated by reference.

BACKGROUND OF THE INVENTION

1. Field of the Invention

The present invention relates generally to a method for semiconductor substrate processing. More specifically, the invention relates to a method for monitoring and detecting optical emission endpoint(s), for photoresist stripping and removal of residues from a substrate or a film stack on a substrate.

2. Description of the Related Art

As a part of semiconductor manufacturing, various layers of dielectric, semiconducting, and conducting films, such as silicon dioxide, polysilicon, and metal compounds and alloys, are deposited on a silicon substrate. Features are defined in these layers by a process including lithography and etching. Such a process comprises coating a substrate with photoresist, patterning the photoresist, and then transferring this pattern to the underlying layers during etching by using the patterned photoresist as an etch mask. Many of these etch processes leave photoresist and post-etch residues on the substrate and must be removed before performing the next process step.

Patterned photoresist also serves as an ion implant mask for preferentially doping semiconductor substrates in selected areas. The doping or implantation process includes exposing the substrate to ions or an electronic beam of implant species, for example, arsenic (As), boron (B, $BF_2$, $BF_4$), phosphorous (P), indium (In), antimony (Sb) and hydrogen (H). The ion implantation process dehydrogenates the photoresist material, resulting in a hydrogen deficient, carbonized crust layer that is typically one to several thousand angstroms thick on top of the bulk photoresist. This makes the characteristics of the photoresist material vertically non-uniform such that uniform removal (stripping) of the photoresist can be difficult. As such, the photoresist removal process may result in non-uniform removal and substantial post-implant residue remaining on the substrate. Consequently, a technique for monitoring removal of the photoresist is necessary such that the photoresist removal process can be controlled as the characteristics of the material change.

Optical emission spectroscopy is commonly used to detect the endpoint of plasma etch processes. Plasma transitions of reactant or by-product species emit photons which can be detected in the ultraviolet, visible and near-infrared ranges. Thus, the endpoint is usually based on increasing signal for reactants or decreasing signal for by-products. The endpoint is identified when either the reactants or by-products attain a specific concentration (i.e., the respective signals cross a threshold level). However, such an endpoint detection technique does not account for the variations in the characteristics of a photoresist layer that has been exposed to an ion beam.

Therefore, there is a need in the art for a method and apparatus for performing optical emission endpoint detection for photoresist strip and residue removal especially when using a chamber having a remote plasma source.

SUMMARY OF THE INVENTION

The invention relates to a method for monitoring and detecting optical emission endpoint(s), more particularly hydrogen emissions within a plasma, for photoresist stripping and removal of residues from a substrate or a film stack on a substrate. In one embodiment, a method is provided that includes positioning a substrate comprising a photoresist layer into a processing chamber; processing the photoresist layer using a multiple step plasma process; and monitoring the plasma for a hydrogen optical emission during the multiple step plasma process; wherein the multiple step plasma process includes removing a bulk of the photoresist layer using a bulk removal step; and switching to an overetch step in response to the monitored hydrogen optical emission.

In another embodiment, a method is provided that includes positioning a substrate comprising a photoresist layer into a processing chamber; processing the photoresist layer using a multiple step plasma process; and monitoring the plasma for both by-product optical emission and a reactant optical emission during the multiple step plasma process; wherein the multiple step plasma process includes removing a bulk of the photoresist layer using a bulk removal step; and switching to an overetch step in response to the monitored hydrogen optical emission.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

The invention relates to a method for monitoring and detecting optical emission endpoint(s), more particularly hydrogen emissions, for photoresist stripping and removal of residues from a substrate or a film stack on a substrate. In one embodiment of the invention, a method determines and uses a hydrogen optical emission peak for identifying an endpoint of a photoresist stripping process, including blanket and patterned photoresist, post-implant photoresist, and post-plasma etch photoresist. In addition, the invention comprises a method to use optical emission endpoint in general, and hydrogen peak specifically, to monitor the transition from crust removal to bulk photoresist removal for post-implant stripping. By this method, the hydrogen endpoint trace is a more direct measure of stripping for patterned implant substrates (compared to other peaks such as oxygen).

The present invention uses, in one embodiment, the hydrogen optical emission peak at 656 nm to monitor endpoint for ion implant strip, and can be applied to other reducing chemistry based stripping processes for strip and residue removal after the etching of low dielectric constant films (low k films), and for other applications.

For the crust removal process in post-implant strip, the hydrogen signal can be especially useful because the crust layer is hydrogen-depleted relative to the bulk photoresist. Thus, in accord with an embodiment of the present invention, monitoring for the rise and leveling-off of the hydrogen peak (656 nm) indicates that the hydrogen-depleted crust layer is removed and that the hydrogen-rich bulk photoresist has been reached. The ability to accurately identify the crust removal clearing time is of use for identifying changes in substrate conditions or in situations where a multi-step stripping recipe is beneficial.

Figure 1A:
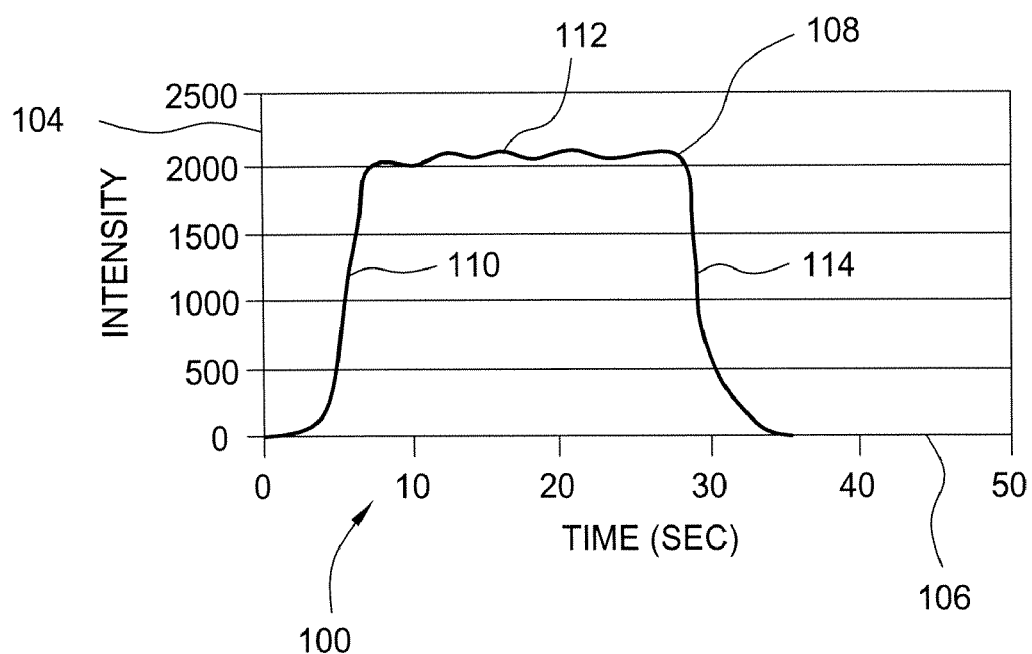
FIGS. 1A and 1B is an illustrative graph of a hydrogen emission peak for a blanket photoresist and an arsenic implanted photoresist.
Figure 1B:
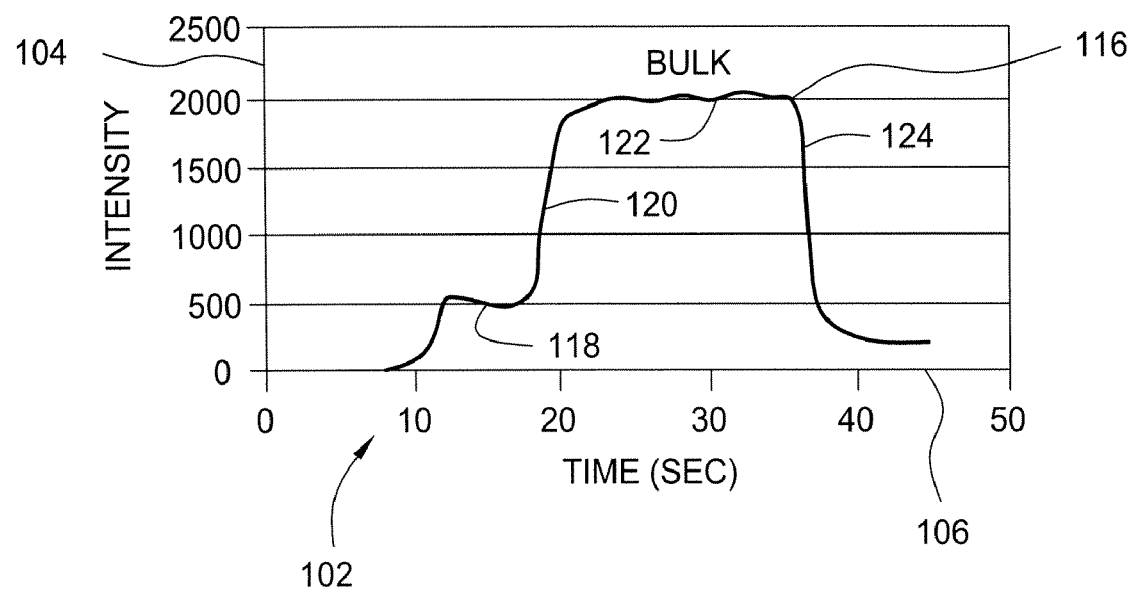
Figure 2:
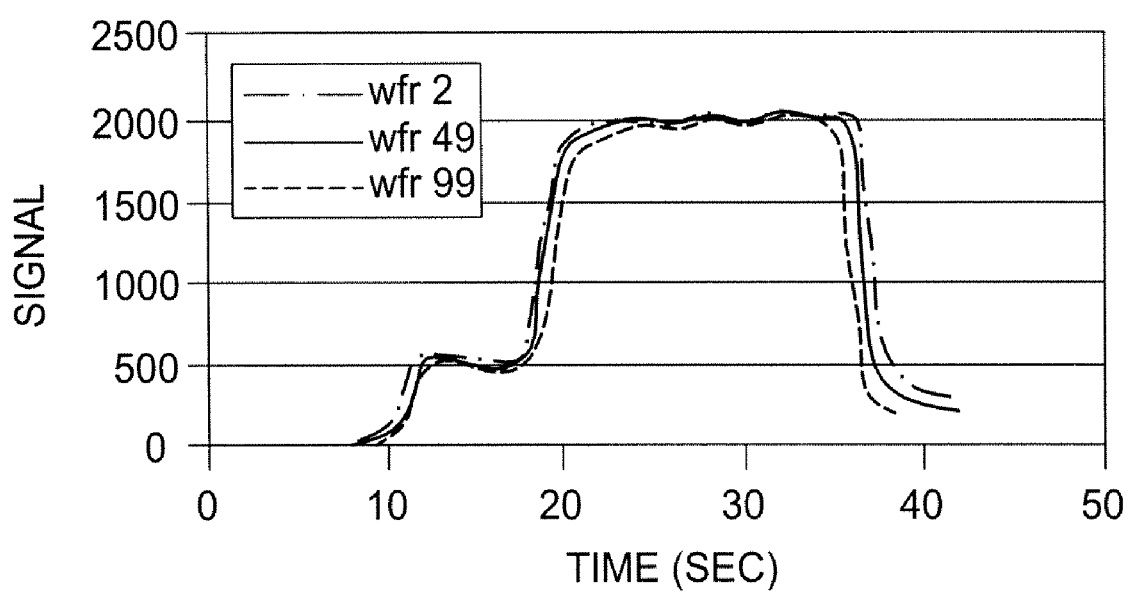
FIG. 2 is an illustrative graph of a hydrogen emission peak for three arsenic implanted substrates during a substrate test showing repeatability of an hydrogen emission peak.

FIGS. 1A-B depict the hydrogen emission trace that occurs during removal of an unimplanted photoresist layer (FIG. 1A) and arsenic implanted photoresist layer (FIG. 1B). The graphs 100 and 102 depict emission intensity (axis 104) versus time (axis 106). During the stripping of photoresist from the unimplanted substrate, the hydrogen emission trace 108 increases (portion 110) then levels off (portion 112), and then decreases (portion 114), allowing endpoint detection as the photoresist clears. For the implanted substrate, the clearing of the crust layer can be easily identified in trace 116. The crust layer is hydrogen deficient as described above, such that the hydrogen emission is low at the beginning of the stripping process (portion 118). As the crust is removed, the hydrogen emission increases (portion 120) until a plateau is reached (122). Finally, the bulk photoresist is removed and the hydrogen emission decreased (portion 124). The repeatability of the hydrogen emission peak during a 100 substrate run with implanted blanket photoresist monitor substrates is evident in the emission graphs for substrates 2, 49, and 99 shown in FIG. 2.

One advantage of the present invention is that the hydrogen signal is created as a process by-product, rather than a process reactant like oxygen. Thus, the change in optical emission signal is a more direct measure of the photoresist removal process, as opposed to a process reactant which is more of an indirect measure of photoresist removal and may also include additional reactions not related to the photoresist removal process (such as reactions with residues on chamber walls or other locations other than the substrate). A by-product peak should be less sensitive to non-uniformity issues, which, for the bulk strip step of post-implant strip, could lead to overly-short process times. While other by-product signals may also be used to signal the end of the crust removal (e.g., the OH peak at ~311 nm), the hydrogen signal is significantly stronger in intensity and more well-defined than any of these other peaks and therefore provides a clearer endpoint trace. In addition, when using the hydrogen peak over the OH peak, it may be advantageous if water vapor is used in the recipe, where the water vapor may mask the OH peak.

Figure 5:
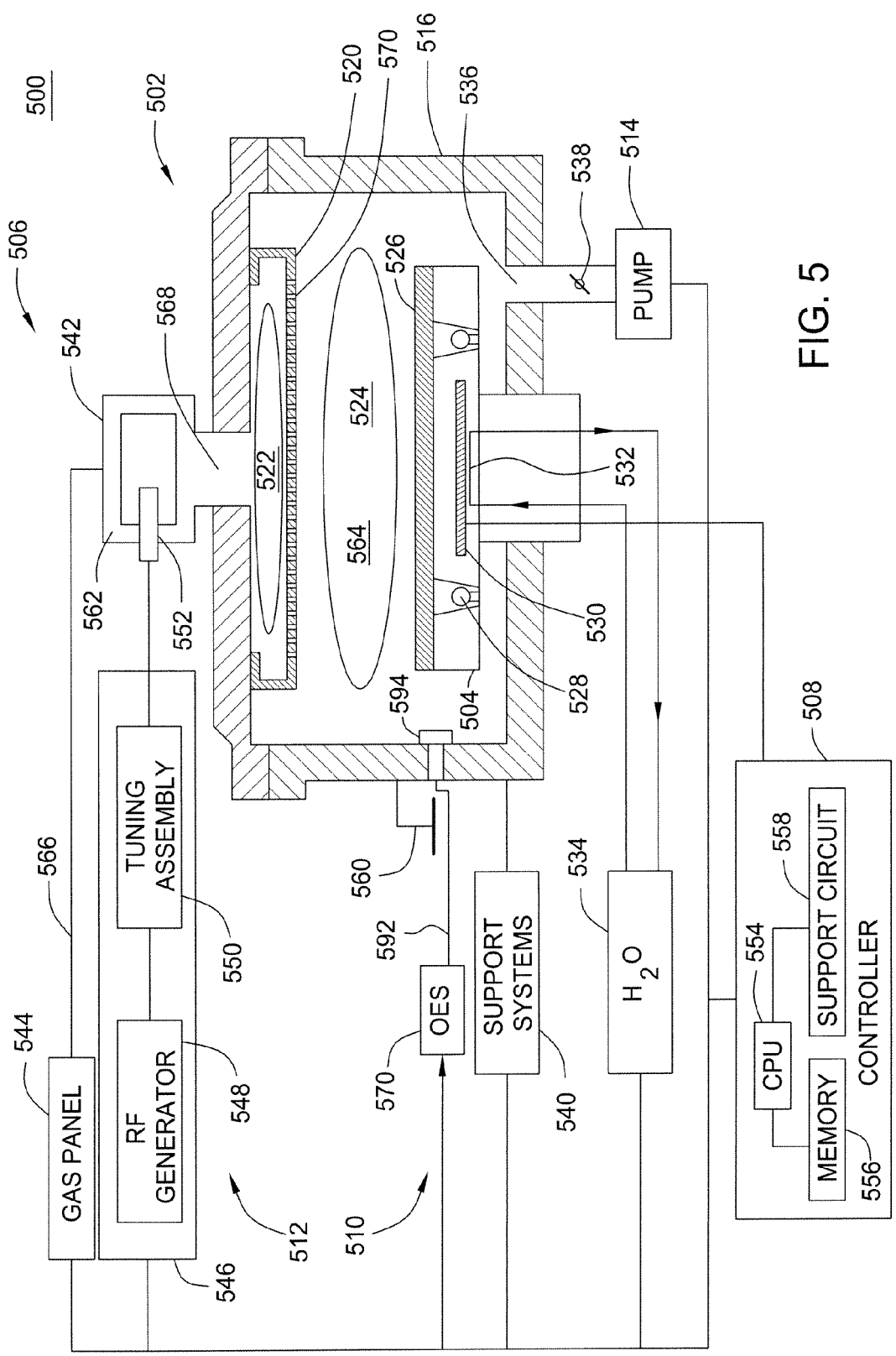
FIG. 5 is a schematic diagram of one embodiment of an illustrative chamber used to perform the method of the present invention.

Furthermore, as a process by-product, the hydrogen emission can be monitored near the substrate surface in a remote plasma source reactor as described with respect to FIG. 5 below.

Figure 3:
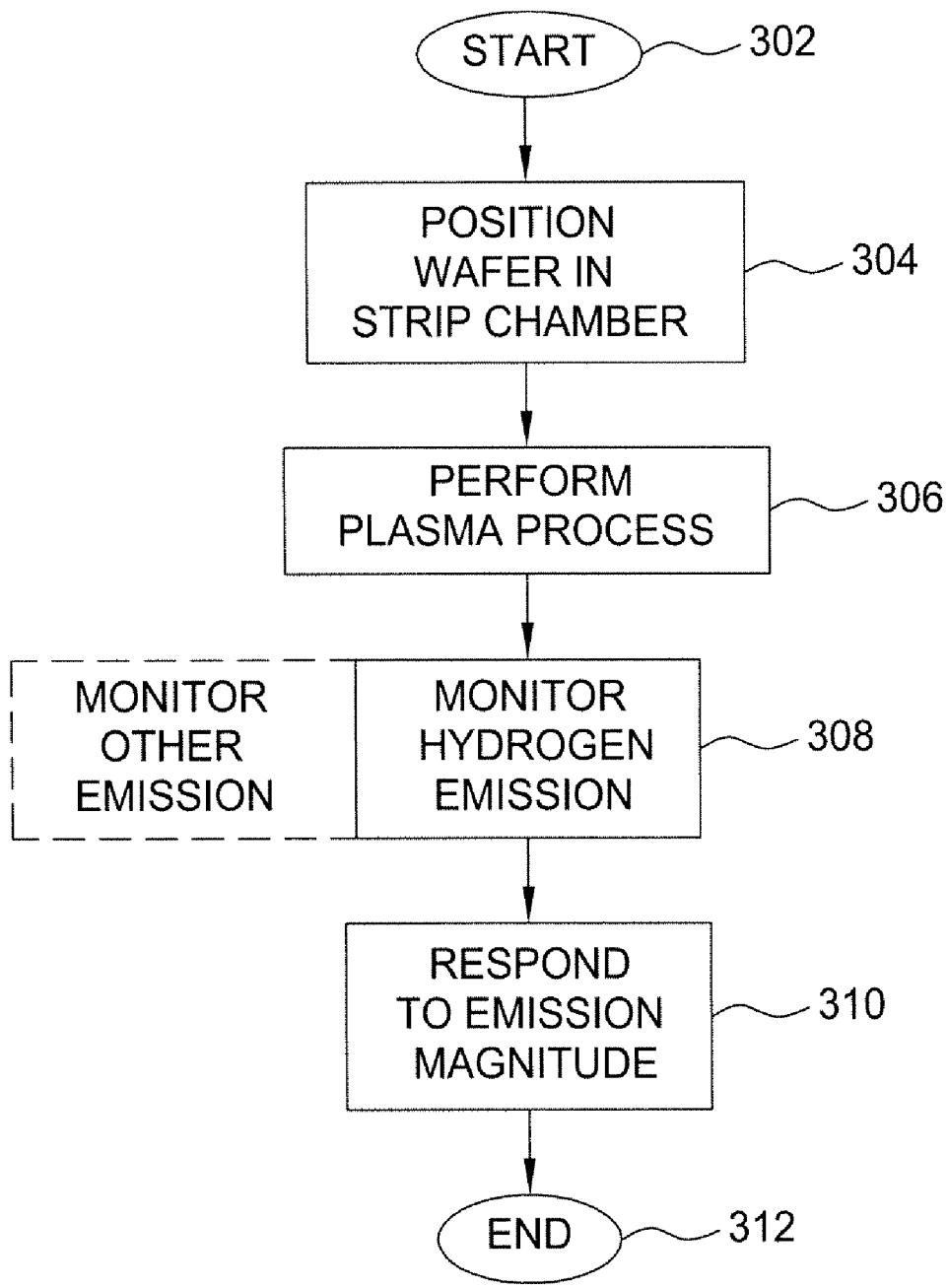
FIG. 3 is a flow diagram of one embodiment of a method of the present invention.

FIG. 3 is a flow diagram of a method 300 of the present invention. The method begins at step 302 and proceeds to step 304 where a substrate is positioned in a process chamber capable of performing photoresist stripping. One such chamber is manufactured under the trademark AXIOM™ by Applied Materials, Inc. and described with respect to FIG. 5 below.

At step 306, the method performs a plasma process in the strip chamber. To remove photoresist, an oxygen-based plasma is used. For example, an oxidizing gas such as $O_2$, is applied to a remote plasma source at a flow rate of 100 to 10,000 sccm. The oxidizing gas is formed into a plasma when 600 to 6000 watts of RF energy is applied to the source. The gas pressure in the chamber is maintained at 0.3 to 3 Torr. The temperature of the substrate is maintained at 15 to 300 degrees Celsius. In one embodiment of the invention, an RF bias of 100 to 2000 watts is applied to the substrate. Various oxidizing gases can be used including, but not limited to, $O_2$ $O_3$, $N_2O$, $H_2O$, $CO$, $CO_2$, alcohols, and various combinations of these gases. In other embodiments of the invention, non-oxidizing gases may be used including, but not limited to, $N_2$, $H_2O$, $H_2$, forming gas, $NH_3$, $CH_4$, $C_2H_6$, various halogenated gases ($CF_4$, $NF_3$, $C_2F_6$, $C_4F_8$, $CH_3F$, $CH_2F_2$, $CHF_3$), combinations of these gases and the like.

At step 308, the method 300 monitors the hydrogen emission within the plasma in the chamber. At step 310, the method responds to the emission magnitude. In one embodiment, the chamber parameters, (e.g., gases, power levels, pressure, temperature and the like) may be altered upon detecting a change in the hydrogen emission. As such, the emission can be used to optimize processing or to cease processing when the photoresist is removed. Alternatively, one chemistry or recipe can be used for photoresist crust removal and a second chemistry or recipe can be used for bulk photoresist removal. Similarly, the bulk photoresist can be removed until another emission change occurs, then a third chemistry or recipe can be used to remove residue that remains from the stripping process. The method 300 ends at step 312.

In another embodiment of the present invention, a method uses a combination of a hydrogen optical emission with one (or more) additional emission peak(s) for more robust and/or flexible endpoint control. As such, step 308 can be used to monitor other emissions (shown in phantom).

Figure 4A:
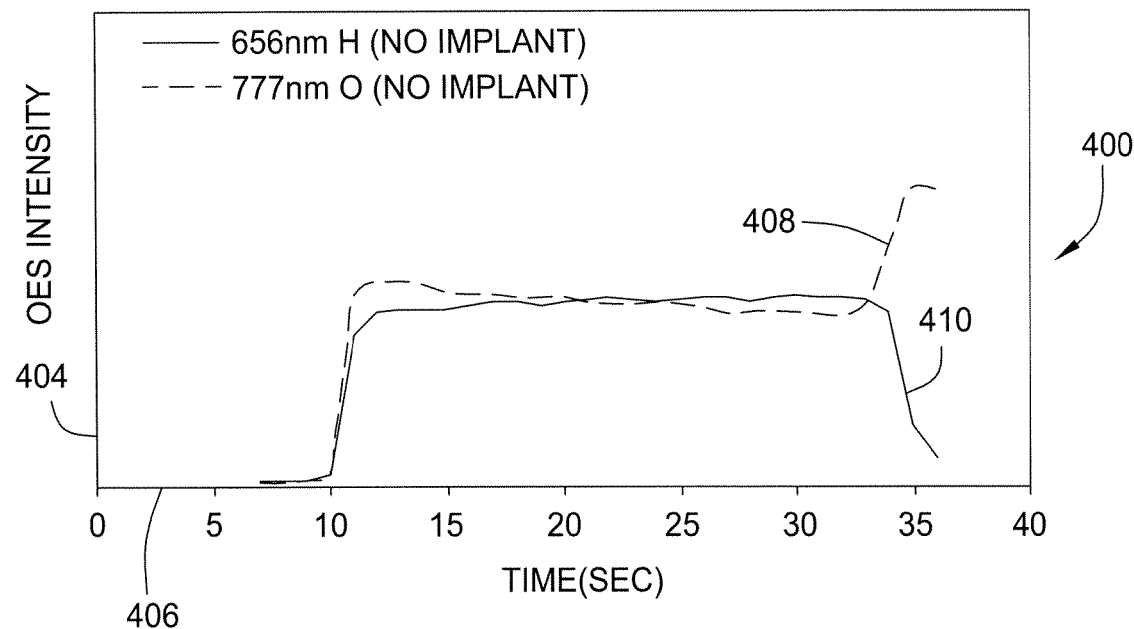
FIGS. 4A-B are illustrative graphs of hydrogen and oxygen emission traces for stripping of unimplanted photoresist (FIG. 4A), arsenic implanted photoresist (FIG. 4B), phosphorous implanted photoresist (FIG. 4C) and boron implanted photoresist (FIG. 4D)
Figure 4B:
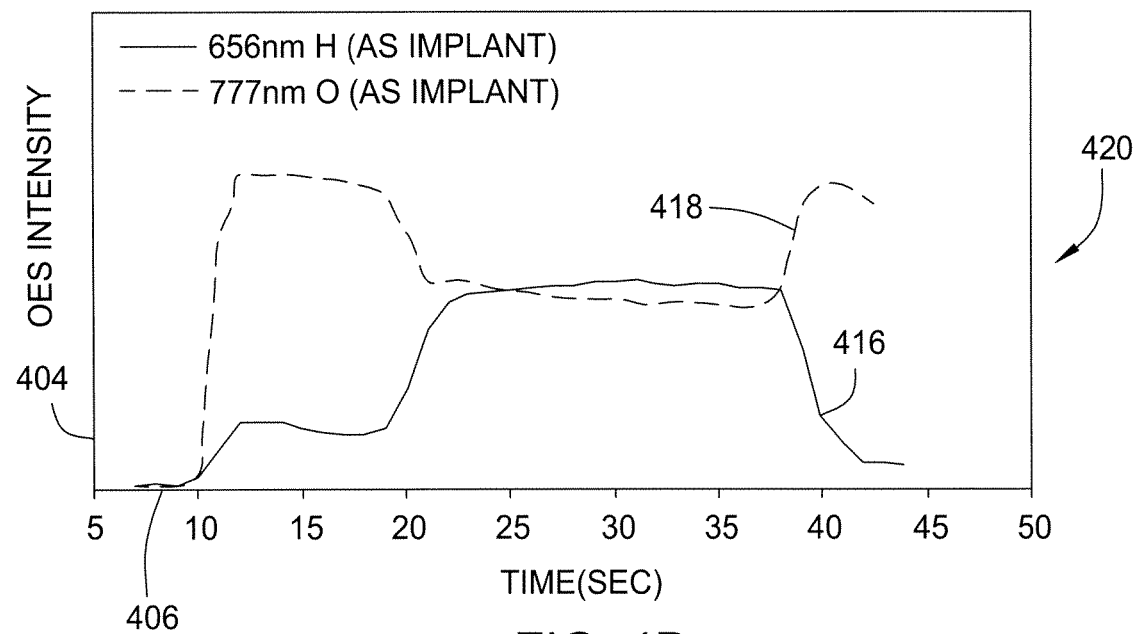
Figure 4C:
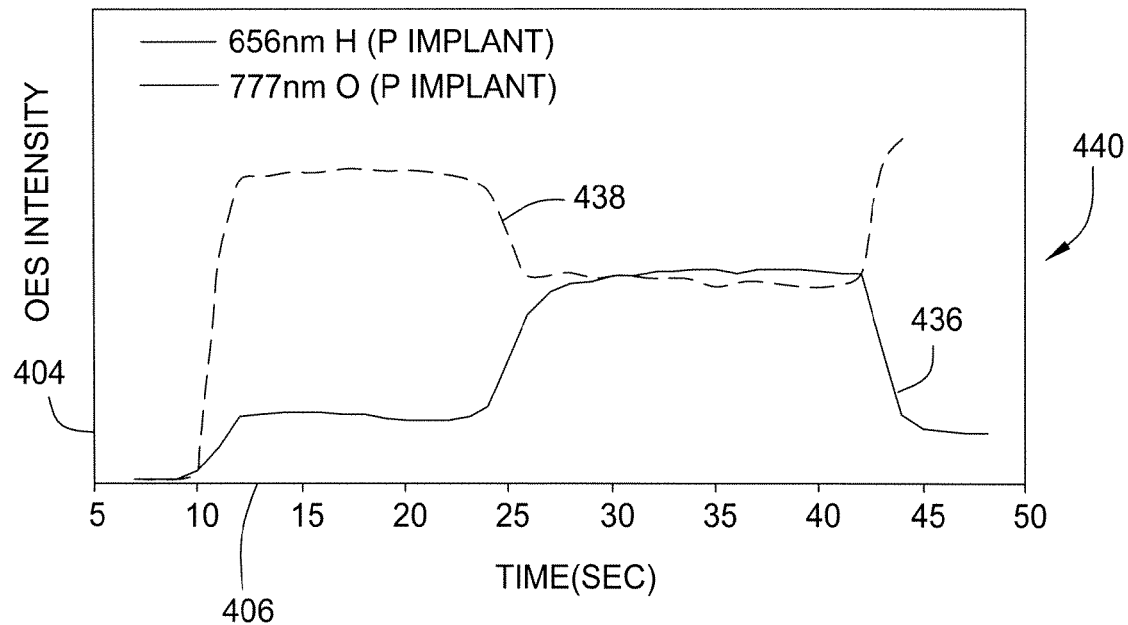
Figure 4D:
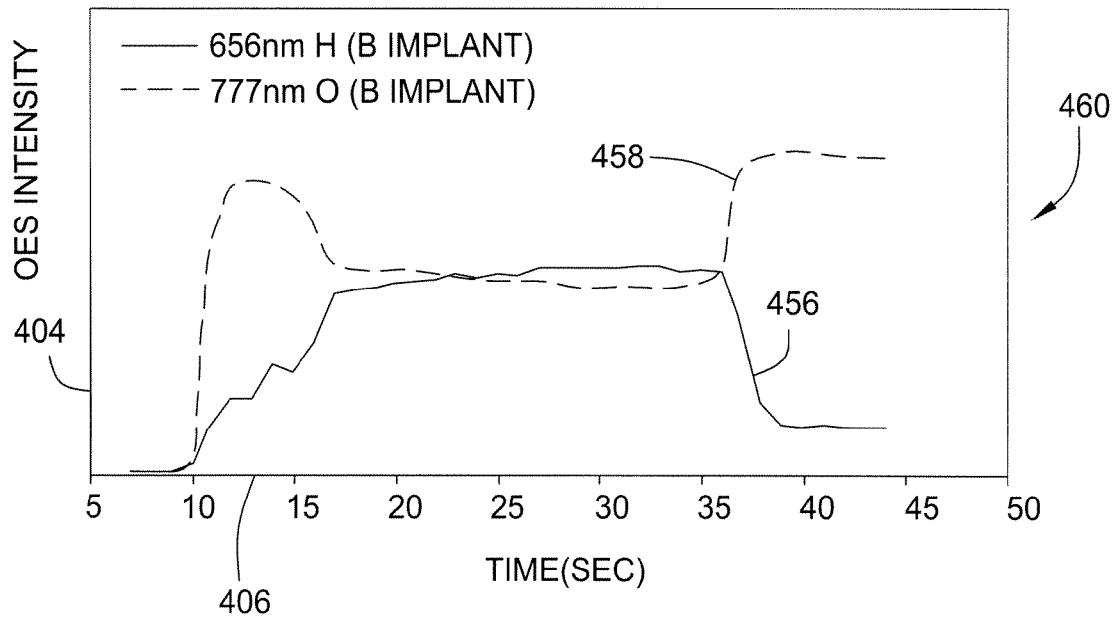

The use of the by-product hydrogen signal in combination with other optical emission peaks can provide several advantages. For example, the reactant oxygen signal provides multiple indicators of stripping though transition layers between the crust and bulk photoresist. Also, the method of the present invention permits identification of an early endpoint indicator by monitoring the reactant oxygen peak and a late/final indicator by monitoring the by-product hydrogen peak. FIGS. 4A-B depicts graphs hydrogen and oxygen optical emission traces during the stripping of blanket unimplanted (graph 400), arsenic implanted photoresist (graph 420), as well as phosphorous (graph 440) and boron (graph 460) implanted photoresist. Each graph depicts emission magnitude (axis 404) versus time (axis 406). In graph 400, the hydrogen emission is trace 408 and the oxygen emission is trace 410 and, in graph 420, the hydrogen emission is trace 418 and the oxygen emission is trace 416. In graph 440, the hydrogen emission is trace 436 and the oxygen emission is trace 438 and, in graph 460, the hydrogen emission is trace 456 and the oxygen emission is trace 458. These data show that the implant species and conditions vary the specific intensity versus time values, but that the general shape of the emissions traces is the same, allowing for use of the method described herein. In this example of an embodiment of the present invention, the hydrogen and oxygen signals mirror each other since the hydrogen is a by-product peak and oxygen is a reactant peak. By measuring and monitoring both wavelengths, the method can incorporate custom endpoint algorithms to minimize risk of mis-processing and maximize throughput by optimizing process duration. In addition, utilization of the present invention can drastically reduce errors by providing a back-up wavelength. In other words, using both signals, simultaneously allows for more robust endpoint capability by providing a backup detection wavelength—if the endpoint is missed at one wavelength, the endpoint can be triggered by the other wavelength. Dual wavelength endpoint triggering occurs when either wavelength meets the endpoint conditions.

The dual wavelength optical emission can provide advantages for other processes, such as post-silicon etch photoresist strip and residue removal, where the process is switched at step 310 of FIG. 3 from resist stripping chemistry to residue removal and/or softening chemistry as the photoresist removal is detected. The combination of the reactant oxygen and by-product hydrogen signals is most useful for controlling the plasma-on time for photoresist removal. Because residues are sometimes more difficult to remove when exposed to excessive oxygen radicals, inaccurate endpoint control can result in overly-long plasma-on times to ensure complete photoresist removal, which in turn reduces the efficacy of residue removal post-treatments. Accurate endpoint control limits the oxidizing plasma exposure, thereby increasing the effectiveness of residue-removal post-treatments.

The present inventive method may be used on a variety of systems as the hardware requirements for the implementation of this invention are not unique. FIG. 5 depicts a schematic diagram of the AXIOM™ reactor (or chamber) 500 that may be used to practice portions of the method 300. The AXIOM reactor 500 is described in detail in U.S. patent application Ser. No. 10/264,664, filed Oct. 4, 2002 and incorporated herein by reference. The reactor 500 comprises a process chamber 502, a remote plasma source 506, and a controller 508.

The process chamber 502 generally is a vacuum vessel, which comprises a first portion 510 and a second portion 512. In one embodiment, the first portion 510 comprises a substrate pedestal 504, a sidewall 516 and a vacuum pump 514. The second portion 512 comprises a lid 518 and a gas distribution plate (showerhead) 520, which defines a gas mixing volume 522 and a reaction volume 524. The lid 518 and sidewall 516 are generally formed from a metal (e.g., aluminum (Al), stainless steel, and the like) and electrically coupled to a ground reference 560. The sidewall comprises a window 594 (quartz) that is used to monitor the optical emissions within the plasma. The window 594 is coupled to a light-collecting device 592 that carries the optical signals to the optical emission spectroscopy (OES) system 590.

The substrate pedestal 504 supports a substrate (wafer) 526 within the reaction volume 524. In one embodiment, the substrate pedestal 504 may comprise a source of radiant heat, such as gas-filled lamps 528, as well as an embedded resistive heater 530 and a conduit 532. The conduit 532 provides cooling water from a source 534 to the backside of the substrate pedestal 504. The substrate sits on the pedestal by gravity or, alternatively, can be mechanically clamped, vacuum clamped, or electrostatically clamped as in an electrostatic chuck. Gas conduction transfers heat from the pedestal 504 to the substrate 526. The temperature of the substrate 526 may be controlled between about 20 and 400 degrees Celsius.

The vacuum pump 514 is adapted to an exhaust port 536 formed in the sidewall 516 of the process chamber 502. The vacuum pump 514 is used to maintain a desired gas pressure in the process chamber 502, as well as evacuate the post-processing gases and other volatile compounds from the chamber. In one embodiment, the vacuum pump 514 is augmented with a throttle valve 538 to control the gas pressure in the process chamber 502.

The process chamber 502 also comprises conventional systems for retaining and releasing the substrate 526, internal diagnostics, and the like. Such systems are collectively depicted in FIG. 5 as support systems 540.

The remote plasma source 506 comprises a power source 546, a gas panel 544, and a remote plasma chamber 542. In one embodiment, the power source 546 comprises a radio-frequency (RF) generator 548, a tuning assembly 550, and an applicator 552. The RF generator 548 is capable of producing of about 200 to 5000 W at a frequency of about 200 to 600 kHz. The applicator 552 is inductively coupled to the remote plasma chamber 542 and energizes a process gas (or gas mixture) 564 to a plasma 562 in the chamber. In this embodiment, the remote plasma chamber 542 has a toroidal geometry that confines the plasma and facilitates efficient generation of radical species, as well as lowers the electron temperature of the plasma. In other embodiments, the remote plasma source 506 may be a microwave plasma source, however, the stripping rates are generally higher using the inductively coupled plasma.

The gas panel 544 uses a conduit 566 to deliver the process gas 564 to the remote plasma chamber 542. The gas panel 544 (or conduit 566) comprises means (not shown), such as mass flow controllers and shut-off valves, to control gas pressure and flow rate for each individual gas supplied to the chamber 542. In the plasma 562, the process gas 564 is ionized and dissociated to form reactive species.

The reactive species are directed into the mixing volume 522 through an inlet port 568 in the lid 518. To minimize charge-up plasma damage to devices on the substrate 526, the ionic species of the process gas 564 are substantially neutralized within the mixing volume 522 before the gas reaches the reaction volume 524 through a plurality of openings 570 in the showerhead 520.

The controller 508 comprises a central processing unit (CPU) 554, a memory 556, and a support circuit 558. The CPU 554 may be any form of a general-purpose computer processor used in an industrial setting. Software routines can be stored in the memory 556, such as random access memory, read only memory, floppy or hard disk, or other form of digital storage. The support circuit 558 is conventionally coupled to the CPU 554 and may comprise cache, clock circuits, input/output sub-systems, power supplies, and the like.

The software routines, when executed by the CPU 554, transform the CPU into a specific purpose computer (controller) 508 that controls the reactor 500 such that the processes (e.g., method 300 of FIG. 3) are performed in accordance with the present invention. The software routines may also be stored and/or executed by a second controller (not shown) that is located remotely from the reactor 500.

The AXIOM™ chamber has a window port 594 for attaching a light-collecting device 592 (e.g., a fiber optic probe and cable) to monitor plasma intensity. The window is located slightly above the substrate plane for collecting emission intensity along a line parallel to the substrate. Optical emission spectroscopy hardware 590 based on either a monochromator that can be set to monitor the emission (above the substrate) of a particular wavelength within the entire spectrum or hardware based on bandwidth filter(s), or even a spectrometer, can be used. An exemplary embodiment of the present invention may use a detector unit with two bandpass filters on the chamber. In such an embodiment, one of the filters includes the 656 nm emission, or hydrogen optical emission peak, wavelength.

In addition to process control and process recipe endpointing, the use of hydrogen, optical emission or hydrogen combined with a second wavelength such as that of oxygen can also be used to monitor chamber health. In such an embodiment of the present invention, a detector unit may be utilized with one or more bandpass filters coupled to the chamber. The oxygen emission peak(s) of 777 nm and/or 845 nm can also be utilized, either singly or jointly in combination with the hydrogen emission peak. The relative intensities of these peaks so measured and monitored could be indicative of the conditions of the plasma sources and chamber surfaces and be used to provide a proper "fingerprint" of a clean or "golden" chamber. The magnitude of the emissions can be used to determine when a cleaning cycle is necessary or whether components within the chamber are degrading, i.e., certain emissions are indicative of chamber health.

While foregoing is directed to embodiments of the present invention, other and further embodiments of the invention may be devised without departing from the basic scope thereof.

The invention claimed is:

1. A method, comprising:
    positioning a substrate comprising a photoresist layer into a processing chamber;
    processing the photoresist layer using a multiple step plasma process; and
    monitoring the plasma for a hydrogen optical emission and an oxygen optical emission during the multiple step plasma process;
    wherein the multiple step plasma process comprises:
        removing a bulk of the photoresist layer using a bulk removal step; and
        switching to an overetch step in response to the monitored hydrogen optical emission or the monitored oxygen optical emission.

2. The method of claim 1, wherein the hydrogen optical emission occurs at a wavelength of about 656 nm.

3. The method of claim 1, wherein the oxygen optical emission occurs at a wavelength of about 777 nm.

4. The method of claim 1, wherein the hydrogen optical emission is correlated with the oxygen optical emission.

5. The method of claim 1, further comprising:
    stopping the multiple step plasma process upon either the hydrogen optical emission obtaining a first level, the oxygen optical emission obtaining a second level, or both.

6. The method of claim 1, further comprising:
    stopping the multiple step plasma process upon the hydrogen optical emission obtaining a predetermined level, the oxygen optical emission obtaining a predetermined level, or both.

7. The method of claim 1, wherein the multiple step plasma process further comprises:
    switching to a residue removal step in response to the monitored hydrogen optical emission or the monitored oxygen optical emission.

8. The method of claim 7, further comprising:
    switching to the residue removal step in response to both the monitored hydrogen optical emission and the monitored oxygen optical emission.

9. The method of claim 1, wherein the photoresist layer comprises a hardened crust layer.

10. The method of claim 9, wherein the multiple step plasma process further comprises:
    etching the crust using a photoresist crust removal step and switching to the bulk removal step in response to the monitored hydrogen optical emission or the monitored oxygen optical emission.

11. The method of claim 10, further comprising:
    switching to the bulk removal step in response to both the monitored hydrogen optical emission and the monitored oxygen optical emission.

12. A method of etching a photoresist layer comprising:
    positioning a substrate comprising a photoresist layer into a processing chamber;
    processing the photoresist layer using a multiple step plasma process; and
    monitoring the plasma for both by-product optical emission and a reactant optical emission during the multiple step plasma process;
    wherein the multiple step plasma process comprises:
        removing a bulk of the photoresist layer using a bulk removal step; and
        switching to an overetch step in response to the monitored by-product optical emission.

13. The method of claim 12, wherein the multiple step plasma process further comprises:
    switching to a residue removal step in response to the monitored by-product and reactant optical emissions.

14. The method of claim 12, wherein the by-product optical emission is correlated with the reactant optical emission.

15. The method of claim 12, further comprising:
    stopping the multiple step plasma process upon either the by-product optical emission obtaining a first level or the reactant optical emission obtaining a second level, or both.

16. The method of claim 12, wherein the photoresist layer comprises a hardened crust layer.

17. The method of claim 16, wherein the multiple step plasma process further comprises:
    etching the crust using a photoresist crust removal step and switching to the bulk removal step in response to the monitored by-product and reactant optical emissions.

18. The method of claim 12, wherein the by-product is hydrogen.

19. The method of claim 18, wherein the hydrogen optical emission occurs at a wavelength of about 656 nm.

20. The method of claim 12, wherein the reactant is oxygen.

21. The method of claim 20, wherein the oxygen optical emission occurs at a wavelength of about 777 nm.

* * * * *